(12) United States Patent
Pi et al.

(10) Patent No.: US 8,260,836 B2
(45) Date of Patent: Sep. 4, 2012

(54) METHOD AND DEVICE FOR GENERATING A FILTER COEFFICIENT IN REAL TIME

(75) Inventors: Xingjun Pi, Shenzhen (CN); Xiaogang Kang, Shenzhen (CN); Yong Jiang, Shenzhen (CN)

(73) Assignee: Shenzhen Mindray Bio-Medical Electronics Co., Ltd., Shenzhen (CN)

( * ) Notice: Subject to any disclaimer, the term of this patent is extended or adjusted under 35 U.S.C. 154(b) by 1345 days.

(21) Appl. No.: 11/927,230

(22) Filed: Oct. 29, 2007

(65) Prior Publication Data

US 2008/0126459 A1 May 29, 2008

(30) Foreign Application Priority Data

Nov. 28, 2006 (CN) .......................... 2006 1 0169352

(51) Int. Cl.
*G06F 17/10* (2006.01)
(52) U.S. Cl. ........................ 708/300; 708/230
(58) Field of Classification Search .................. None
See application file for complete search history.

(56) References Cited

U.S. PATENT DOCUMENTS

| | | | |
|---|---|---|---|
| 5,739,691 A | 4/1998 | Hoenninger, III | |
| 5,928,312 A | 7/1999 | Shichiku et al. | |
| 6,142,942 A | 11/2000 | Clark | |
| 6,304,679 B1 | 10/2001 | Clingerman et al. | |
| 2002/0012390 A1 | 1/2002 | Kim | |

FOREIGN PATENT DOCUMENTS

| | | |
|---|---|---|
| CN | 1396711 | 2/2003 |
| CN | 1566984 | 1/2005 |

OTHER PUBLICATIONS

China patent application No. 200610169352.5, Search Report dated Jul. 13, 2007.

*Primary Examiner* — Chat Do
*Assistant Examiner* — Michael D Yaary
(74) *Attorney, Agent, or Firm* — Kory D. Christensen; Stoel Rives LLP

(57) ABSTRACT

The present invention provides a method and device for generating a filter coefficient in real time. The method includes: looking up a converted window function value in a converted window function table based on a current coefficient index; generating a current cut-off angular frequency; generating a look-up table address based on the current coefficient index, the filter order and the current cut-off angular frequency and looking up a sine value in a sine table based on the look-up table address; and multiplying the converted window function value by the sine value to obtain the filter coefficient. The device includes a first memory, a second memory, a look-up table address generation module and a first multiplier. The present invention is easily implemented with low hardware resource consumption and high flexibility, and is particularly applicable for the hardware implementation of high-order finite impulse response filters.

11 Claims, 5 Drawing Sheets

METHOD AND DEVICE FOR GENERATING A FILTER COEFFICIENT IN REAL TIME

STATEMENT OF RELATED APPLICATION

The present application claims the priority of the Chinese Patent Application No. 200610169352.5, entitled "Method and Device for Generating Filter Coefficients in Real Time", filed on Nov. 28, 2006, which is incorporated herein by reference.

FIELD OF THE INVENTION

The present invention relates to a method and device for generating a filter coefficient in real time, and more particularly, to a method and device for generating a filter coefficient in real time adapted for use in an ultrasound imaging system.

BACKGROUND OF THE INVENTION

In an ultrasound imaging system, a front-end transmitted waveform is modulated both in amplitude and in phase after entering a human body, and the resultant echo must be demodulated before obtaining the information about the modulated wave. The demodulation is a process for frequency shifting and low pass filtering. The ultrasound wave exhibits different frequency attenuation characteristics in different depths inside the human body. The deeper the ultrasound wave reaches inside the body, the more high frequency components attenuate. Therefore, the central frequency of the echo decreases gradually with the increasing depth, so does the echo bandwidth. As a consequence, the cut-off angular frequency of the filter decreases gradually with time. As the cut-off angular frequency of the filter determines the filter coefficients, the filter coefficients may be also adjusted with time.

FIG. 1 shows a typical signal processing flow of an ultrasound imaging system. Upon beamforming, ultrasound echo signals are combined to form a radio frequency echo signal, which is then frequency shifted to obtain both baseband components and multiple frequency components. Only the baseband components are left when both components are low pass filtered. The echo data is deinterleaved to obtain scan data at the same position but at different times, and then is filtered by a wall filter, which is a high pass filter that removes the stronger low frequency tissue motion components and retains the weaker high frequency blood stream motion components. An auto-correlation operation is performed on the wall-filtered data to obtain the components of the speed vector of the blood stream on the coordinate axes and the blood stream energy information. These blood stream parameters are then further processed to obtain the speed, energy and variance information of the blood stream, and the information on these parameters is displayed after a scan conversion.

In principle, the above demodulation process is typical and simple, which comprises frequency shifting and filtering only. The filtering process can be implemented with the knowledge of the filter coefficients only. There are numerous methods for obtaining the filter coefficients. One is to prepare the coefficients in advance, which will be written into the on-chip random access memory or the off-chip storage apparatus of a programmable device using system software. When a coefficient is used, it will be fetched from the on-chip random access memory or the off-chip storage apparatus. However, when the filter order is approximately up to several hundreds of orders and the number of bits for quantization is high, for the filter that is changed with time, an intolerably high demand will be placed on the storage capacity if the coefficients needs pre-storing in the on-chip random access memory. For example, in case of a 100-order filter, 16-bit quantization and 20 sets of coefficients to be stored, the total storage capacity is 100*16*20=32 Kbits. Though the demand on the storage capacity is acceptable when using an off-chip storage apparatus, the filtering is finished at the expense of the addition of extra off-chip storage apparatus. Therefore, this method is inadvisable for the filter.

U.S. Pat. No. 6,142,942 by Clark et al. introduces a method of adaptive filter coefficient generation. The method need not store a large number of coefficients, as the coefficients are generated in real time. According to this method, the coefficients are generated in different time periods taking advantage of the statistical characteristics of the echo data. The data are then filtered to be further processed.

As above described, there are two methods for generating filter coefficients in the prior art. One is to generate all of the coefficients in advance, and store these coefficients in the on-chip or off-chip storage apparatus, which will be fetched from the storage apparatus when they are used. This method is applicable when the filter order is small and small sets of coefficients are to be stored. However, in an ultrasound imaging system, the filter order is high, normally up to several hundreds of orders, and dozens of different coefficient sets are to be stored, which take up a huge amount of storage space. For the adaptive filter, the coefficients need not be pre-stored, but generated in real time in accordance with the statistical characteristics of the data in different time periods. However, this method demands a large amount of statistical signal processing, so the algorithm is rather complicated and time-consuming. For the programmable device with limited resources, the second method is also inadvisable.

SUMMARY OF THE INVENTION

The object of the present invention is to calculate filter coefficients in real time for each time segment based on a varying cut-off angular frequency. The filter coefficients can be obtained with only the knowledge of the cut-off angular frequency of the filter. As we know, a cut-off angular frequency value corresponds to a set of coefficients. As a consequence, storing the cut-off angular frequency takes up a much smaller amount of storage space than storing its corresponding coefficients in an on-chip random access memory.

According to a first aspect of the present invention, there is provided a method for generating a filter coefficient in real time, comprising: looking up a first intermediate value in a first memory in which a converted window function table is stored, based on a current coefficient index; generating a look-up table address based on the current coefficient index, the filter order and a current cut-off angular frequency; looking up a second intermediate value in a second memory in which a sine table is stored, based on the look-up table address; and multiplying the first intermediate value by the second intermediate value to obtain the filter coefficient.

According to the first aspect of the present invention, generating the look-up table address comprises: converting the current coefficient index to obtain a third intermediate value; generating the current cut-off angular frequency; and multiplying the third intermediate value by the current cut-off angular frequency to obtain the look-up table address.

According to the first aspect of the present invention, converting the current coefficient index is realized using the following equation:

$$T_n = 2n+1-N,$$

wherein, $T_n$ is the third intermediate value; n is the current coefficient index, n=0, 1, ..., N−1; and N is the filter order.

According to the first aspect of the present invention, generating the current cut-off angular frequency comprises: looking up a current cut-off angular frequency change in a third memory in which a cut-off angular frequency change table is stored, based on the sequence number of a current time segment generated by a counter; and adding a previous cut-off angular frequency stored in a register and the current cut-off angular frequency change to obtain the current cut-off angular frequency.

According to the first aspect of the present invention, the filter coefficient is calculated using the following equation:

$$h(n) = \sin[(2n+1-N)*k*\text{pi}/M] \cdot \frac{(0.54 - 0.46\cos(2*\text{pi}*n/(N-1)))}{\text{pi}*(n-(N-1)/2)}$$

wherein, h(n) is the filter coefficient; n is the current coefficient index, n=0, 1, ..., N−1; N is the filter order; k is the current cut-off angular frequency; and M is the integral power of two.

According to a second aspect of the present invention, there is provided a device for generating a filter coefficient in real time, comprising: a first memory for storing a converted window function table, such that a first intermediate value is looked up in the first memory using a current coefficient index; a look-up table address generation module for generating a look-up table address based on the current coefficient index, the filter order and a current cut-off angular frequency; a second memory for storing a sine table, such that a second intermediate value is looked up in the second memory using the look-up table address; and a first multiplier for multiplying the first intermediate value by the second intermediate value to obtain the filter coefficient.

According to the second aspect of the present invention, the look-up table address generation module comprises: an index conversion unit for converting the current coefficient index to obtain a third intermediate value; a cut-off angular frequency generation unit for generating the current cut-off angular frequency; and a second multiplier for multiplying the third intermediate value by the current cut-off angular frequency to obtain the look-up table address.

According to the second aspect of the present invention, the index conversion performed by the index conversion unit is calculated using the following equation:

$T_n=2n+1-N,$ wherein, $T_n$ is the third intermediate value; n is the current coefficient index, n=0, 1, ..., N−1; and N is the filter order.

According to the second aspect of the present invention, the cut-off angular frequency generation unit comprises: a counter for generating the sequence number of a current time segment; a third memory for storing a cut-off angular frequency change table, such that a current cut-off angular frequency change is looked up in the third memory using the sequence number of the current time segment; a register for storing a previous cut-off angular frequency; and an adder for adding the previous cut-off angular frequency and the current cut-off angular frequency change to obtain the current cut-off angular frequency.

According to the second aspect of the present invention, the counter is a uniform counter.

According to the second aspect of the present invention, the first memory and the third memory are random access memories, while the second memory is a read only memory.

According to the second aspect of the present invention, the first multiplier calculates the filter coefficient using the following equation:

$$h(n) = \sin[(2n+1-N)*k*\text{pi}/M] \cdot \frac{(0.54 - 0.46\cos(2*\text{pi}*n/(N-1)))}{\text{pi}*(n-(N-1)/2)}$$

wherein, h(n) is the filter coefficient; N is the filter order; n is the current coefficient index, n=0, 1, ..., N−1; k is the current cut-off angular frequency; and M is the integral power of two.

The present invention is easily implemented with low programmable hardware resource consumption and high flexibility. By means of adjusting the values stored in the sine table and the converted window function table, the present invention is also applicable to the case of a variety of filters and window functions, as well as filters with the cut-off angular frequency varying arbitrarily. Particularly, it is applicable for the hardware implementation of high-order finite impulse response filters.

BRIEF DESCRIPTION OF THE DRAWINGS

The present invention will become more apparent from the following description of specific embodiments with reference to the drawings.

DETAILED DESCRIPTION OF THE INVENTION

Figure 1:
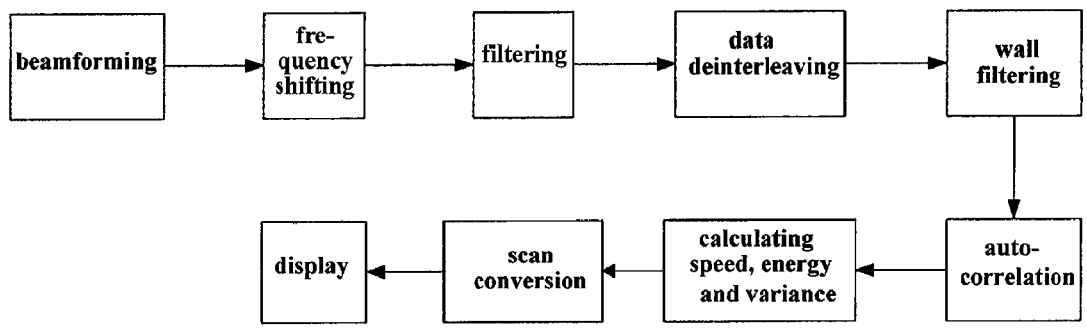
FIG. 1 shows a typical signal processing flow of an ultrasound imaging system.

According to a first embodiment of the present invention, there is provided a method for generating a filter coefficient in real time. The method comprises: looking up a first intermediate value in a first memory in which a converted window function table is stored, based on a current coefficient index; generating a look-up table address based on the current coefficient index, the filter order and a current cut-off angular frequency; looking up a second intermediate value in a second memory in which a sine table is stored, based on the look-up table address; and multiplying the first intermediate value by the second intermediate value to obtain the filter coefficient. Said method for generating a filter coefficient in real time will be illustrated in greater details hereunder.

As an initial matter, some basic concepts of filters need to be explained. One of the most common methods of designing a filter is a windowed ideal filter method. The coefficients of an ideal filter are obtained based on the cut-off angular frequency of the filter to be designed. The ideal filter is noncasual and is practically unrealizable. Therefore, the coefficients of the ideal filter are then multiplied by the corresponding window function values. Upon shifting, the resultant coefficients determine the filter to be designed that is causal and practically realizable. In the following description of the embodiments of the present invention, for the sake of explanation and description, it is assumed that the window function is a Hamming window, and that the coefficients of a low pass filter are to be generated. However, it is not intended that the invention is limited thereto.

Assuming that the order of the low pass filter is N (N is even), according to the above windowed ideal filter method, a coefficient of the low pass filter is calculated as:

$$h(n') = \frac{\sin(n'\omega_c)}{n'\omega_c} \cdot (0.54 + 0.46\cos*(2*\mathrm{pi}*n'/N)) \quad (1)$$

wherein $$n' = \mathrm{round}\left(-\frac{N}{2}+1\right), \ldots, \mathrm{round}\left(\frac{N}{2}\right)$$

Let $$n = n' + \mathrm{floor}\left(\frac{N}{2}\right) - 1,$$

after shifting, then $$h(n) = \sin\left[\left(n - \frac{N-1}{2}\right)\omega_c\right] \cdot \frac{(0.54 - 0.46\cos(2*\mathrm{pi}*n/(N-1)))}{\mathrm{pi}*(n-(N-1)/2)} \quad (2)$$

wherein $\omega_c$ is the cut-off angular frequency of the low pass filter; and n is the coefficient index of the low pass filter (n=0, 1, ..., N−1). Then, the coefficient of the low pass filter is calculated by multiplying two product terms, one relating to a sine value, and the other relating to a Hamming window.

If $\omega_c = k*2\mathrm{pi}/M$, k is a value of $\omega_c$ quantized by $2\mathrm{pi}/M$, k=0~M−1; M is the integral power of two, for example, 256. Then, the first product term of the above equation (2) is:

$$\sin\left[\left(n - \frac{N-1}{2}\right)\omega_c\right] = \sin[(2n+1-N)*k*\mathrm{pi}/M] \quad (3)$$

The result of equation (3) can be looked up in a sine table having a length of M, which contains sine values of M angles equally divided between 0 and pi. The second product term of the above equation (2) is a converted window function value, which can be calculated in advance, stored in a random access memory and looked up in the random access memory based on the coefficient index n. As seen from above, a coefficient of the low pass filter is obtainable by looking up twice and multiplying once.

Figure 2:
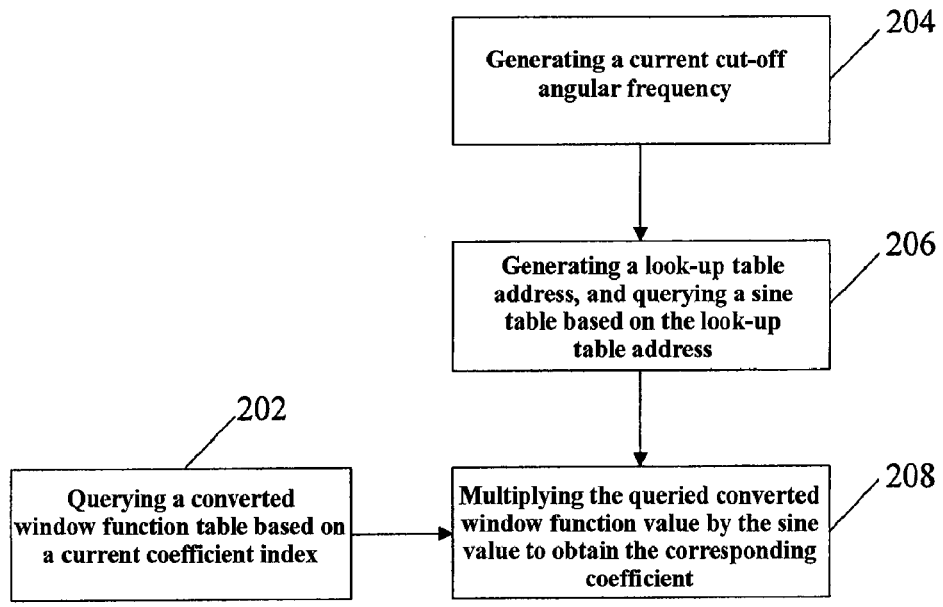
FIG. 2 is a flowchart showing the real-time generation of a filter coefficient according to the present invention.

FIG. 2 shows a flowchart of the real-time generation of a filter coefficient, comprising the following steps of: looking up a converted window function value in a converted window function table based on a current coefficient index (step 202); generating a current cut-off angular frequency (step 204); generating a look-up table address based on the current coefficient index, the filter order and the current cut-off angular frequency and looking up a sine value in a sine table based on the look-up table address (step 206); and multiplying the converted window function value by the sine value to obtain the filter coefficient (step 208). Various steps will be described in greater details hereunder.

For an N-order low pass filter, its coefficient index is represented by n, n=0, 1, ..., N−1. In step 202, the index n is used directly to query a converted window function table. It can be seen from the equation (2) that the table is not a standard Hamming window function table, but a converted window function table obtained by dividing the Hamming window function by a certain value. The converted window function table is stored in a dual-port random access memory, one end of which is write only, the other end of which is read only, and the depth of which is N. Filters of different orders have different initial values. These values are written into a system through a software interface during the initialization of the system. The content of the table will be updated whenever the filter order is changed. The quantization accuracy of these values depends on the circumstances, normally a 16-bit signed number. In the design of filters, to achieve better performance, the type of the window function may be changed as, for example, Blackman window or Hanning window, etc.

Figure 3:
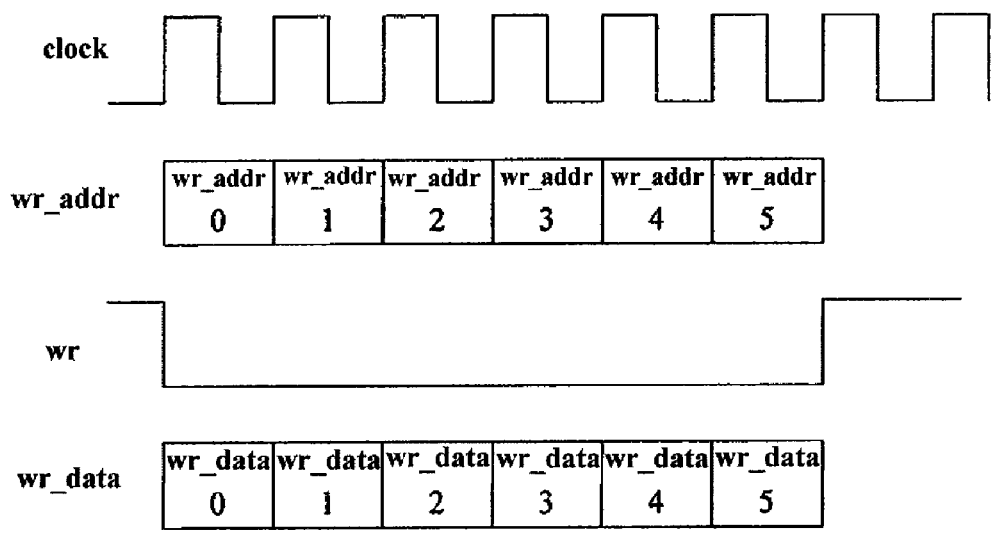
FIG. 3 is a timing diagram of writing data into a converted window function table.
Figure 4:
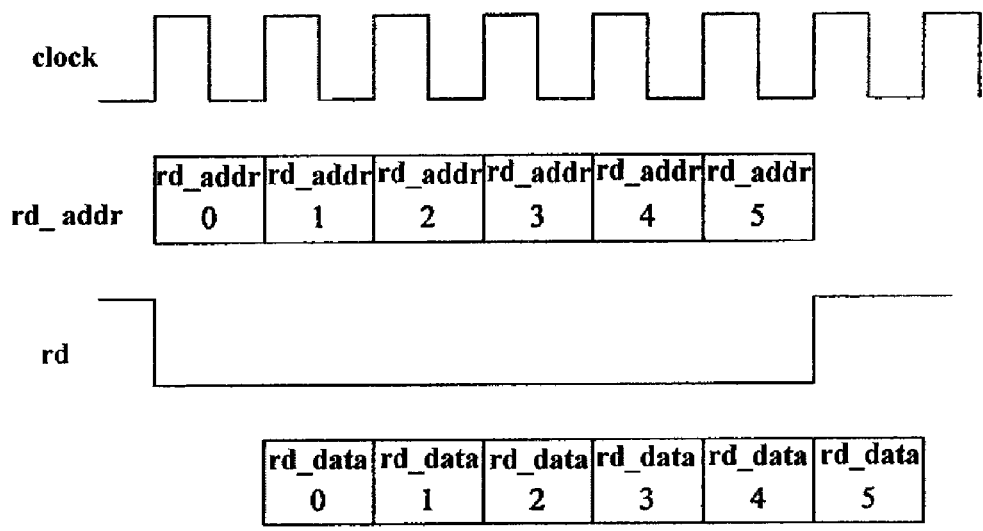
FIG. 4 is a timing diagram of reading data from a converted window function table.

FIG. 3 is a timing diagram of writing data into a converted window function table, and FIG. 4 is a timing diagram of reading data from a converted window function table.

Figure 5:
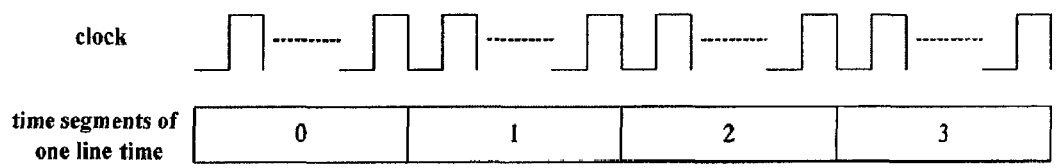
FIG. 5 shows one line time is equally divided into a plurality of time segments.
Figure 6:
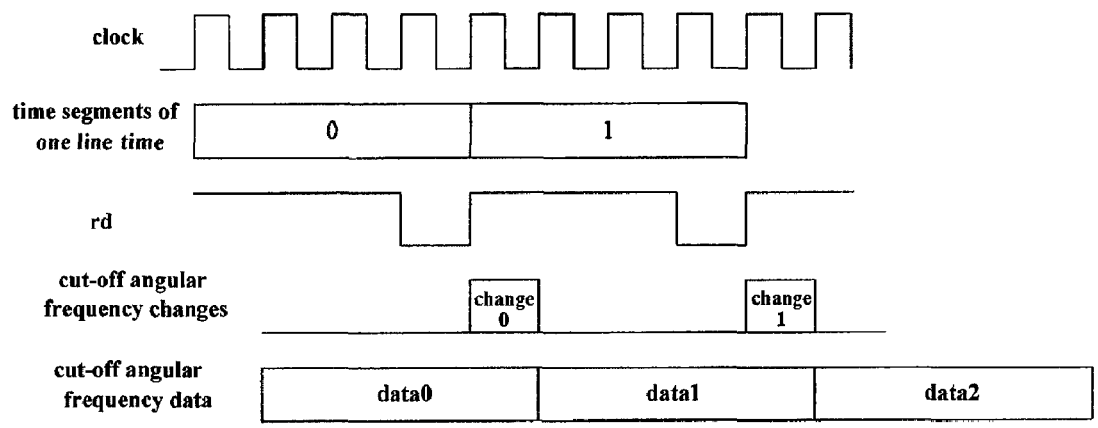
FIG. 6 is a timing diagram of the generation of a current cut-off angular frequency according to the present invention.

In case of the black and white signal processing of an ultrasound system, as the detecting depth increases, the central frequency is shifted towards a low frequency, and the bandwidth decreases. Therefore, the cut-off angular frequency of the filter gradually decreases with time, which should be considered in designing the filter. In step 204, a current cut-off angular frequency is generated, which is specifically described as follows. After a cut-off angular frequency change is quantized, it is stored in an on-chip random access memory, and the bit width is represented by a 3-bit complement, which may be incremented or decremented or even may remain constant, depending on its content. The random access memory has a rather small capacity, and data are written therein during the initialization of the system. One line time is equally divided into a plurality of time segments, the sequence numbers of which are generated by a counter. The sequence number of the current time segment is utilized to look up the current cut-off angular frequency change in a cut-off angular frequency change table. The current cut-off angular frequency change and the previous cut-off angular frequency stored in the register are added to lead to the cut-off angular frequency k for the current time segment. FIG. 5 shows one line time is equally divided into a plurality of time segments, and FIG. 6 is a timing diagram of the generation of a current cut-off angular frequency.

Figure 7:
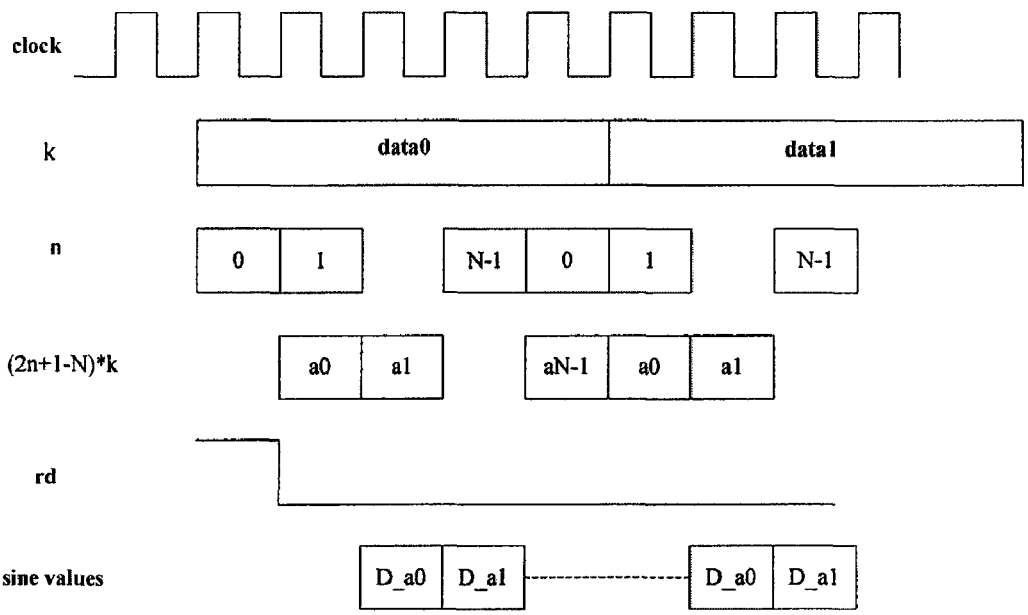
FIG. 7 is a timing diagram of the generation of a look-up table address and the look-up according to the present invention.

In step 206, a look-up table address is generated based on the coefficient index n, the filter order N and the current cut-off angular frequency k. A sine table is then queried, so as to obtain a sine value. Specifically, an index conversion should be implemented before querying the sine table, i.e., an intermediate value $T_n$ should be computed via (2n+1−N) from n and N. $T_n*k$ is then calculated to obtain the look-up table address. The depth of the sine table is related to the quantization accuracy of the cut-off angular frequency. For example, in case of 256 angles equally divided between 0 and 2 pi, the cut-off angular frequency k in the equation (3) ranges from 0 to 127, and the depth of the sine table is 256. The sine values in the sine table are normally quantized into 16-bit numbers. In view of the symmetry of the sine values, it is only necessary to store the values concerning one quadrant, thus reducing the data to be stored down to ¼. The lower 8 bits of the result of $T_n*k$ are taken, among which the lower 6 bits are used directly for querying, and the higher two bits are used as a criterion for determining the sign and rotation. Normally, the sine values are relatively constant without having to be written by software. It is feasible to use a read only memory after the initial values are assigned. Therefore, the content of the read only memory needs re-initialization only when a change occurs to the demand on the quantization accuracy of the cut-off angular frequency or the quantization accuracy of the sine value. FIG. 7 is a timing diagram of the generation of a look-up table address and the look-up according to the present invention.

Figure 8:
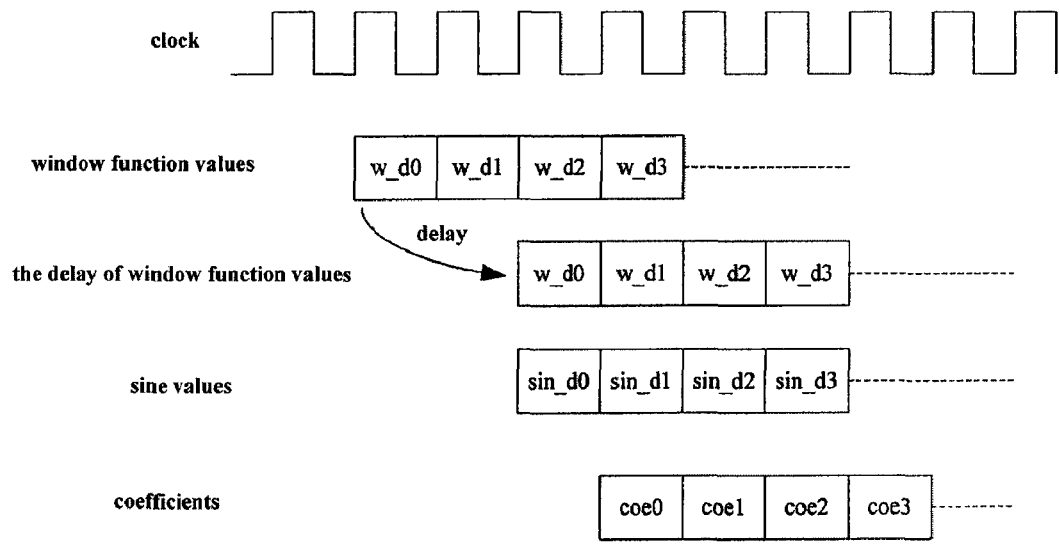
FIG. 8 is a timing diagram of outputting a filter coefficient.

In step 208, the converted window function value is multiplied by the sine value to obtain the filter coefficient. In some embodiments, despite the same coefficient index, the converted window function value obtained from the converted window function table has a different delay than that of the sine value obtained from the sine table. Since more steps are involved in acquiring the sine value, a larger delay is required for obtaining the sine value. In view of the difference in delay, it is required that the resultant converted window function value be delayed synchronously, so as to make sure that the sine value and the converted window function value that are based on the same coefficient index are aligned with each other in timing. All of the queried results are outputted as a complement, and then multiplied. The multiplication result is truncated as the coefficient. FIG. 8 is a timing diagram of outputting a filter coefficient.

The method for generating low pass filter coefficients in real time according to this embodiment may be easily extended to generate high pass, bandpass or band-stop filter coefficients in real time.

In a second embodiment of the present invention, there is provided a device for generating a filter coefficient in real time, which will be described in details below with reference to FIG. 9 and FIG. 10.

Figure 9:
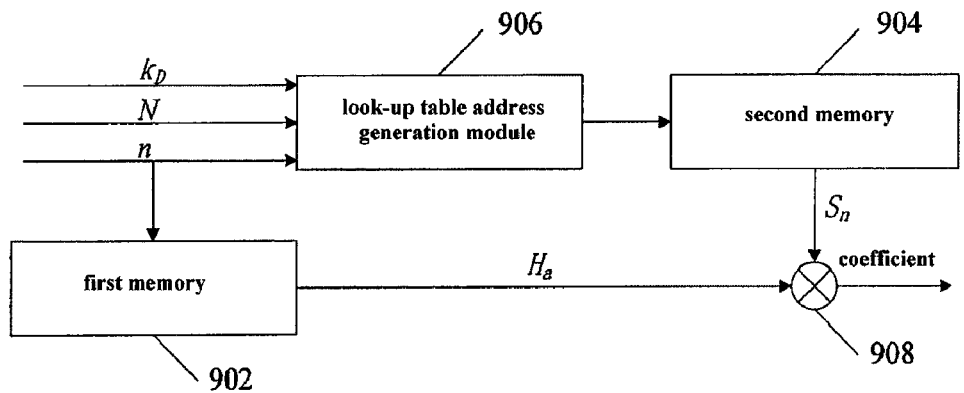
FIG. 9 is a structural block diagram of the device for generating a filter coefficient in real time according to the present invention.

FIG. 9 is a structural block diagram of the device for generating a filter coefficient in real time according to the present invention. As shown in FIG. 9, the device comprises a first memory 902, a second memory 904, a look-up table address generation module 906 and a first multiplier 908. The first memory 902 is a random access memory for storing a converted window function table. The second memory 904 is a read only memory for storing a sine table. The current coefficient index n is used to query the first memory 902, so as to obtain the converted window function value $H_a$. The look-up table address generation module 906 generates the look-up table address based on the current coefficient index n, the filter order N and the current cut-off angular frequency $k_D$, which will be further described below. The look-up table address generated by the look-up table address generation module 906 is used to query the second memory 904, so as to obtain the sine value $S_n$. The first multiplier 908 then multiplies the converted window function value $H_a$ by the sine value $S_n$ to obtain the filter coefficient.

Figure 10:
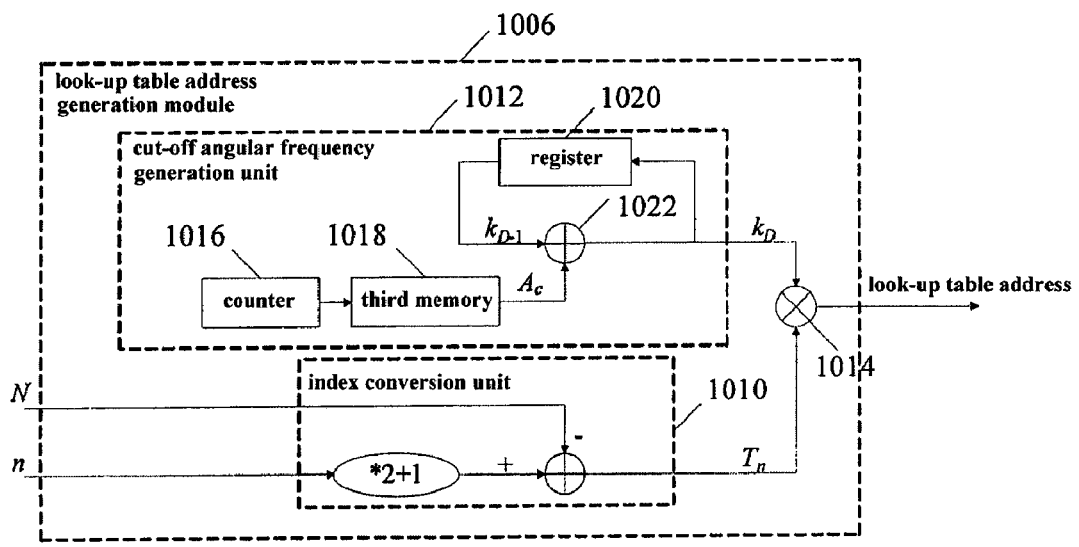
FIG. 10 is a structural block diagram of the look-up table address generation module according to the present invention.

FIG. 10 is a structural block diagram of the look-up table address generation module 1006 according to the present invention. The look-up table address generation module 1006 comprises an index conversion unit 1010 for converting the current coefficient index n, so as to obtain the intermediate value $T_n$ ($T_n=2n+1-N$); a cut-off angular frequency generation unit 1012 for generating the current cut-off angular frequency $k_D$; and a second multiplier 1014 for multiplying the current cut-off angular frequency $k_D$ by the intermediate value $T_n$ to obtain the look-up table address. As shown in the figure, the cut-off angular frequency generation unit 1012 comprises a counter 1016, a third memory 1018, a register 1020 and an adder 1022. The third memory 1018 is a random access memory for storing a cut-off angular frequency change table. The register 1020 stores the previous cut-off angular frequency $k_{D-1}$. The counter 1016 is a uniform counter for generating the sequence number of the current time segment, which is utilized to query the third memory 1018 to obtain the current cut-off angular frequency change $A_c$. The adder 1022 adds the current cut-off angular frequency change $A_c$ and the previous cut-off angular frequency $k_{D-1}$ to obtain the current cut-off angular frequency $k_D$.

In this embodiment, the previous cut-off angular frequency $k_{D-1}$, the current cut-off angular frequency change $A_c$ and the current cut-off angular frequency $k_D$ are all values quantized by $2*pi/M$, wherein M is the integral power of two, such as 256.

It can be seen from the above description that the present invention needs to store a cut-off angular frequency change table, a ¼ cycle sine table and a converted window function table only, which take up a small amount of storage space. When the present invention is implemented by an ALTERA programmable device, 6 M4K memory cells are sufficient. In a specific practice, only two multipliers are sufficient that may be a dedicated hardware multiplier of the programmable device without requiring a logical unit for implementing the function of the multiplier. In a specific practice, logical units may be used to implement a uniform counter, an adder and a register. Only 200 logical units suffice, taking up rather small resources. The present invention may be applied to any other types of filters, such as high pass filters, bandpass filters and band-stop filters, by merely modifying the values in the sine table. In the case of a filter with the cut-off angular frequency unchanged with time, it suffices to set the content of the cut-off angular frequency change table to 0. If other types of window functions are demanded, such as Bartlett window, rectangular window etc., it is only necessary to change values of the converted window function table to adapt to the different window functions. In the case where multiple filter coefficients are required to be outputted concurrently, it may copy the hardware and carry out concurrent queries, or alternatively may employ a high speed clock to multiplex coefficient indexes and output the desired result, and then subject the result to a serial-to-parallel conversion. The present invention is suitable for designing a filter whose order is very high, e.g., several hundreds of orders, and whose coefficients are changeable with time.

The present invention is not only applicable to ultrasound imaging systems as above described, but also applicable to radar signal processing systems and communication systems.

Although the invention has been described above with reference to specific embodiments thereof, it is not intended that the invention be limited to the above-mentioned embodiments. Various modifications and alternations may be made to the present invention without departing from the scope of the present invention. The scope of the present invention is defined by the appended claims. Such words as "first", "second" and "third" used in the description and the claims of the present invention are merely illustrative and should by no means be considered as restrictive.

What is claimed is:

1. A method for generating a filter coefficient in real time, comprising:
   looking up a first intermediate value in a first memory in which a converted window function table is stored, based on a current coefficient index;
   generating a look-up table address, via a look-up table address generation module, the look up table address based on the current coefficient index, a filter order and a current cut-off angular frequency;
looking up a second intermediate value in a second memory in which a sine table is stored, based on the look-up table address; and
multiplying, via a multiplier, the first intermediate value by the second intermediate value to obtain the filter coefficient;
wherein generating the look-up table address comprises:
converting, via an index conversion unit, the current coefficient index to obtain a third intermediate value, wherein converting the current coefficient index is realized using the following equation:

$$T_n=2_n+1-N,$$

wherein, $T_n$ is the third intermediate value; n is the current coefficient index, n=0, 1, . . . , N−1; and N is the filter order;
generating, via a cut-off angular frequency generation unit, the current cut-off angular frequency; and
multiplying, via a second multiplier, the third intermediate value by the current cut-off angular frequency to obtain the look-up table address.

2. The method of claim 1, wherein generating the current cut-off angular frequency comprises:
looking up a current cut-off angular frequency change in a third memory in which a cut-off angular frequency change table is stored, based on the sequence number of a current time segment generated by a counter; and
adding, via an adder, a previous cut-off angular frequency stored in a register and the current cut-off angular frequency change to obtain the current cut-off angular frequency.

3. The method of claim 2, wherein the filter coefficient is calculated using the following equation:

$$h(n) = \sin[(2n+1-N)*k*\mathrm{pi}/M] \cdot \frac{(0.54 - 0.46\cos(2*\mathrm{pi}*n/(N-1)))}{\mathrm{pi}*(n-(N-1)/2)}$$

wherein, h(n) is the filter coefficient; n is the current coefficient index, n=0, 1, . . . , N−1; N is the filter order; k is the current cut-off angular frequency; and M is the integral power of two.

4. A device for generating a filter coefficient in real time, comprising:
a first memory for storing a converted window function table, such that a first intermediate value is looked up in the first memory using a current coefficient index;
a look-up table address generation module for generating a look-up table address based on the current coefficient index, a filter order and a current cut-off angular frequency;
a second memory for storing a sine table, such that a second intermediate value is looked up in the second memory using the look-up table address; and
a first multiplier for multiplying the first intermediate value by the second intermediate value to obtain the filter coefficient;
wherein the look-up table address generation module comprises:
an index conversion unit for converting the current coefficient index to obtain a third intermediate value, wherein the index conversion performed by the index conversion unit is calculated using the following equation:

$$T_n=2_n+1-N,$$

wherein, $T_n$ is the third intermediate value; n is the current coefficient index, n=0, 1, . . . , N−1; and N is the filter order;
a cut-off angular frequency generation unit for generating the current cut-off angular frequency; and
a second multiplier for multiplying the third intermediate value by the current cut-off angular frequency to obtain the look-up table address.

5. The device of claim 4, wherein the first memory is a random access memory.

6. The device of claim 4, wherein the second memory is a read only memory.

7. The device of claim 4, wherein the cut-off angular frequency generation unit comprises:
a counter for generating the sequence number of a current time segment;
a third memory for storing a cut-off angular frequency change table, such that a current cut-off angular frequency change is looked up in the third memory using the sequence number of the current time segment;
a register for storing a previous cut-off angular frequency; and
an adder for adding the previous cut-off angular frequency and the current cut-off angular frequency change to obtain the current cut-off angular frequency.

8. The device of claim 7, wherein the counter is a uniform counter.

9. The device of claim 7, wherein the third memory is a random access memory.

10. The device of claim 7, wherein the first multiplier calculates the filter coefficient using the following equation:

$$h(n) = \sin[(2n+1-N)*k*\mathrm{pi}/M] \cdot \frac{(0.54 - 0.46\cos(2*\mathrm{pi}*n/(N-1)))}{\mathrm{pi}*(n-(N-1)/2)}$$

wherein, h(n) is the filter coefficient; N is the filter order; n is the current coefficient index, n=0, 1, . . . , N−1; k is the current cut-off angular frequency; and M is the integral power of two.

11. A method for generating a filter coefficient in real time, comprising:
looking up a first intermediate value in a first memory in which a converted window function table is stored, based on a current coefficient index;
generating a look-up table address, via a look-up table address generation module, the look up table address based on the current coefficient index, a filter order and a current cut-off angular frequency;
looking up a second intermediate value in a second memory in which a sine table is stored, based on the look-up table address; and multiplying, via a multiplier, the first intermediate value by the second intermediate value to obtain the filter coefficient;

wherein generating the look-up table address comprises:
converting, via an index conversion unit, the current coefficient index to obtain a third intermediate value;
generating, via a cut-off angular frequency generation unit, the current cut-off angular frequency; and
multiplying, via a second multiplier, the third intermediate value by the current cut-off angular frequency to obtain the look-up table address;

wherein generating the current cut-off angular frequency comprises:
looking up a current cut-off angular frequency change in a third memory in which a cut-off angular frequency change table is stored, based on the sequence number of a current time segment generated by a counter; and adding, via an adder, a previous cut-off angular frequency stored in a register and the current cut-off angular frequency change to obtain the current cut-off angular frequency; and wherein the filter coefficient is calculated using the following equation:

$$h(n) = \sin[(2n + 1 - N) * k * \text{pi}/M] \cdot \frac{(0.54 - 0.46\cos(2 * \text{pi} * n/(N-1)))}{\text{pi} * (n - (N-1)/2)}$$

wherein, $h(n)$ is the filter coefficient; n is the current coefficient index, n=0, 1, ..., N−1; N is the filter order; k is the current cut-off angular frequency; and M is the integral power of two.

* * * * *